US006668204B2

(12) United States Patent
Neoh

(10) Patent No.: US 6,668,204 B2
(45) Date of Patent: Dec. 23, 2003

(54) BIAURAL (2CHANNEL LISTENING DEVICE THAT IS EQUALIZED IN-STU TO COMPENSATE FOR DIFFERENCES BETWEEN LEFT AND RIGHT EARPHONE TRANSDUCERS AND THE EARS THEMSELVES

(75) Inventor: Chong Lim Neoh, Singapore (SG)

(73) Assignee: Free Systems Pte, Ltd., Singapore (SG)

( * ) Notice: Subject to any disclaimer, the term of this patent is extended or adjusted under 35 U.S.C. 154(b) by 0 days.

(21) Appl. No.: 09/969,691

(22) Filed: Oct. 3, 2001

(65) Prior Publication Data

US 2002/0040254 A1 Apr. 4, 2002

Related U.S. Application Data

(60) Provisional application No. 60/237,641, filed on Oct. 3, 2000.

(51) Int. Cl.[7] .......................... G06F 17/00; H04R 3/00; H03G 3/00

(52) U.S. Cl. ............................ 700/94; 381/112; 381/61

(58) Field of Search ............................ 381/77, 74, 312, 381/328, 610; 700/94; 455/41, 568, 569

(56) References Cited

U.S. PATENT DOCUMENTS

| | | | | | |
|---|---|---|---|---|---|
| 4,412,106 | A | * | 10/1983 | Pavel | 179/156 |
| 5,136,651 | A | | 8/1992 | Cooper et al. | 381/25 |
| 5,247,293 | A | | 9/1993 | Nakagawa | 340/825.25 |
| 5,500,902 | A | | 3/1996 | Stockham, Jr. et al. | 381/68.4 |
| 4,396,806 | A | * | 6/1998 | Anderson | 381/103 |
| 5,939,656 | A | | 8/1999 | Suda | 84/630 |
| 5,983,100 | A | * | 11/1999 | Johansson et al. | 455/426 |
| 6,005,947 | A | | 12/1999 | Lim | 381/17 |
| 6,072,885 | A | | 6/2000 | Stockham, Jr. et al. | 381/321 |
| 6,104,822 | A | | 8/2000 | Melanson et al. | 381/320 |
| 6,111,958 | A | | 8/2000 | Maher | 381/17 |
| 6,128,392 | A | | 10/2000 | Leysieffer et al. | 381/318 |
| 6,212,496 | B1 | * | 4/2001 | Campbell et al. | 704/221 |
| 6,379,314 | B1 | * | 4/2002 | Horn | 600/559 |
| 2001/0033664 | A1 | * | 10/2001 | Poux et al. | 381/60 |

FOREIGN PATENT DOCUMENTS

| | | |
|---|---|---|
| EP | 0 933970 A2 | 4/1999 |
| EP | 0 634084 B1 | 1/2000 |

* cited by examiner

*Primary Examiner*—Forester W. Isen
*Assistant Examiner*—Elizabeth McChesney
(74) *Attorney, Agent, or Firm*—George O. Saile; Stephen B. Ackerman; Rosemary L. S. Pike

(57) ABSTRACT

Described is a device and method using an interactive process to improve the listening experience for a user of headphones or hearing aids. The system uses a sound source such as a PC or similar device. Programming of the headphone or hearing aid is accomplished using a process delivered by the sound source. The user is prompted to listen to various signals thereby testing the frequency response of each ear and headphone combination. Once the user testing is completed, individualized compensation coefficients are created to optimize the listening experience for the user. The coefficients would be downloaded to and stored within the hearing aids. Downloading could accomplished by wire or by wireless means such as infrared, radio frequency, magnetic or electromagnetic coupling. In headphone units, the compensation factors could be stored either within the headphones or maintained at the sound source. In addition, headphone units could be operated with or without wires (using infrared, radio frequency, magnetic or electromagnetic coupling) for downloading or audio listening.

30 Claims, 2 Drawing Sheets

BIAURAL (2CHANNEL LISTENING DEVICE THAT IS EQUALIZED IN-STU TO COMPENSATE FOR DIFFERENCES BETWEEN LEFT AND RIGHT EARPHONE TRANSDUCERS AND THE EARS THEMSELVES

The instant application claims priority to U.S. Provisional Application, Ser. No. 60/237,641, filed Oct. 3, 2000, which is herein incorporated by reference.

BACKGROUND OF THE INVENTION (1) Field of the Invention

The invention generally relates to an audio headphone or hearing aid device and, more particularly, to a headphone or hearing aid device that allows for compensation of imperfections in the listener's hearing.

(2) Description of Prior Art

The most popular current means of personal on-demand audio entertainment is delivered by means of headphones connected to a source device by wires. The sound source may be portable as in the typical Walkman (registered trade name) device shown in FIG. 1. Here the audio content is stored in magnetic, optical or solid state media (not shown) housed within the player 10. The signals from these media are converted to audio signals that are amplified prior to delivery by wires 12 to transducers within headphones or earphones 14. Other sound sources may not be portable such as typical home stereo systems.

Hearing-impaired persons are fitted with hearing aids, sometimes in both ears. Transducers for both headphones and hearing aids are typically electro-mechanical devices that cannot be matched during manufacturing within reasonable costs. The auditory responses of both left and right ears are not perfectly matched; however, current headphone devices assume that they are. With imperfections of both the transducers and the ears, the auditory perception of the position of the audio source may be shifted from the original location. If measurements are made of the ear responses and correctional hearing aids manufactured, proper correction may not be achieved due to imprecise matching of transducers.

Several methods have been devised for improvement of hearing aid devices. U.S. Pat. No. 6,104,822 to Melanson et al. describes a hearing aid device with multiple user selectable digital signal processing methods for improving hearing under different listening environments. U.S. Pat. No. 6,128,392 and European Patent 0 933 970 A2 to Leysieffer et al. describe a hearing aid device using finite impulse response filtering to achieve feedback compensation. Hanson (European Patent 0 634 084 B1) describes a hearing aid feedback compensation device where adaption rates vary depending upon signal conditions. U.S. Pat. No. 5,500,902 to Stockham, Jr. et al. describes a hearing aid device with a plurality of bandpass filters each with a corresponding automatic gain control. This allows volume compensation over different frequency ranges. U.S. Pat. No. 6,072,885 also to Stockham, Jr. et al. expands the previous invention by providing separate low and high frequency output transducers.

Improvements have also been made in the spatial perception experience for audio listeners. U.S. Pat. No. 5,136,651 to Cooper et al. describes an audio system whereby compensation for head diffraction is accomplished. U.S. Pat. No. 5,939,656 to Suda describes an audio system that compensates for the differences in frequency and sound image location between speakers and headphones. U.S. Pat. No. 6,005,947 to Lim describes an acoustic processing system that mimics the quality of an acoustically ideal listening room. U.S. Pat. No. 6,111,958 to Maher describes an audio processing system that improves the spatial imaging of signals.

The wires often used in headphone systems can impede motion of the user and are prone to failure due to handling. Several methods have been devised to eliminate this problem. One such method is U.S. Pat. No. 5,247,293 to Nakagawa shown in FIG. 2 where the player 10 and headphones 14 are separated. The two units are coupled by radio frequency signals allowing transmission of the audio signal to a smaller, less cumbersome, remote unit 18. The headphones 14 still use wires 12. The remote unit 18 allows control of the player 10 functions such as volume, fast forward, etc. Vertical Horizon markets a headphone unit (Korea patent pending number 99-24278) that allows downloading of 32 Mbytes of MP3 audio content from a computer parallel port. In this case, the storage and controls are all contained within the headphone unit. Downloading is accomplished through a wired connection. Sennheiser markets a wireless listening system where a transmitter unit is connected to an audio source. This is coupled via a 900 MHz radio frequency signal to a pair of headphones.

SUMMARY OF THE INVENTION

A principal object of the present invention is to provide an audio headphone device having an interactive process whereby compensation for imperfections in the hearing of the user may be accomplished.

A second object of the present invention is to provide an audio headphone device having an interactive process where compensation for imperfections in the hearing of the user may be accomplished and where correction information may be stored within the headphone device.

Another object of the present invention is to provide an audio headphone device having an interactive process where compensation for imperfections in the hearing of the user may be accomplished and where correction information may be stored within the sound source.

Another object of the present invention is to provide an audio headphone device having an interactive process where compensation for imperfections in the hearing of the user may be accomplished and where correction information may be stored within a personal computer.

Another object of the present invention is to provide an audio headphone device having an interactive process provided by a personal computer or other sound source whereby compensation for imperfections in the hearing of the user may be accomplished.

A still further object of the present invention is to provide an audio headphone device having an interactive process whereby compensation for imperfections in the hearing of the user may be accomplished where connection to the sound source is achieved using wireless means such as infrared, radio frequency or electromagnetic means.

A still further object of the present invention is to provide a hearing aid device having an interactive process whereby compensation for imperfections in the hearing of the user may be accomplished.

A yet further object of the present invention is to provide a hearing aid device having an interactive process where compensation for imperfections in the hearing of the user may be accomplished and where correction information may be stored within the hearing aid device.

Another object of the present invention is to provide a hearing aid device having an interactive process provided by a personal computer or other sound source whereby compensation for imperfections in the hearing of the user may be accomplished.

Another object of the present invention is to provide a device having an interactive process provided by a personal computer or other sound source whereby compensation for imperfections in the transducers may be accomplished.

These objects are achieved using a system with a headphone or hearing aid unit and a sound source. Programming of the headphone or hearing aid is accomplished using an interactive and iterative process delivered by a personal computer (PC) or similar device. The user is prompted to listen to various signals delivered by the PC thereby testing the frequency response of each ear and headphone combination. Once the testing is completed, individualized compensation factors are created to optimize the listening experience for the user. In the case of a hearing aid device, these compensation factors would be stored within the hearing aids and could be downloaded by wire or by wireless means such as infrared, radio frequency, magnetic or electromagnetic coupling. In headphone units, the compensation factors could be stored within the headphones or at the sound source. In addition, headphone units may be operated by wireless means using infrared, radio frequency, magnetic coupling or other electromagnetic means for both testing and audio listening modes.

BRIEF DESCRIPTION OF THE DRAWINGS

In the accompanying drawings forming a material part of this description, there is shown.

DESCRIPTION OF THE PREFERRED EMBODIMENTS

The present invention allows for compensation of hearing anomalies for both headphone and hearing aid devices. The devices described may also be used to overcome deficiencies within the actual transducer used in the headphone or hearing aid.

Figure 1:
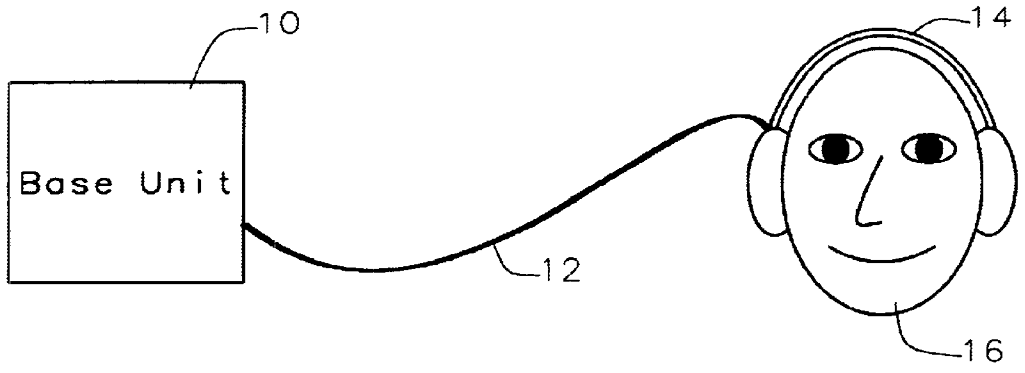
FIG. 1 Prior Art
FIG. 1 illustrating a prior art example of a wired personal audio entertainment device.
Figure 2:
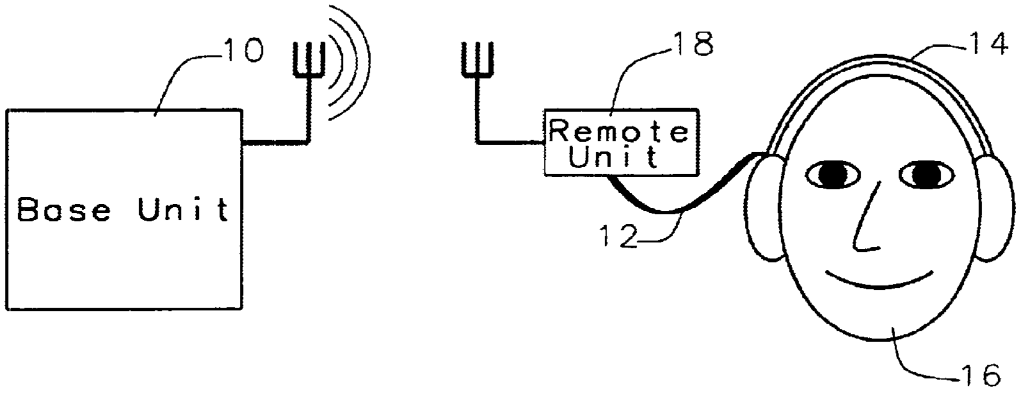
FIG. 2 Prior Art
FIG. 2 illustrating a prior art example of a wireless personal audio entertainment device.
Figure 3:
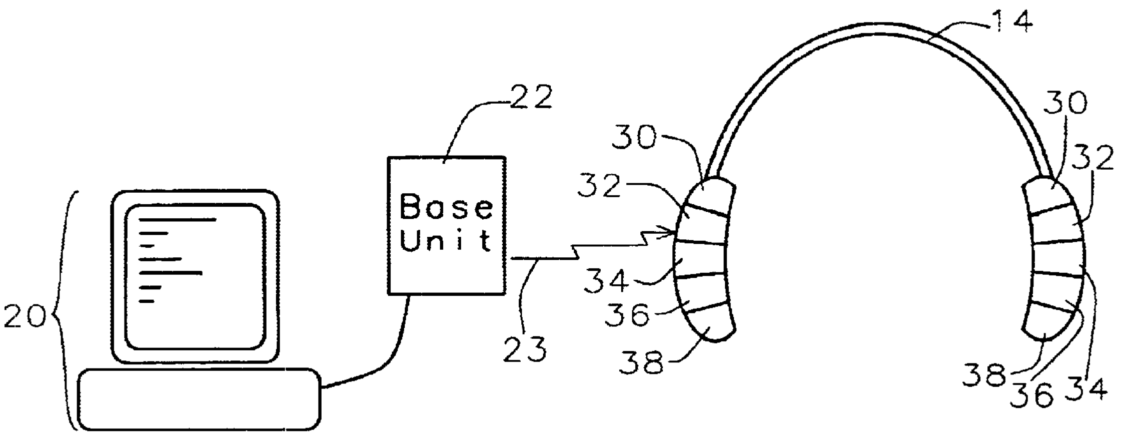
FIG. 3 illustrating a preferred embodiment of the present invention with headphones.

Refer now to FIG. 3, showing a system overview of one embodiment of the present invention used in conjunction with a headphone system. A personal computer or other sound source 20 is connected by wire to a base unit 22. The sound source 20 provides both an audio source and a user interface. A preferably wireless headphone unit 14 contains a receiver 30 for downloading information from the base unit 22, solid-state memory 32 for storing audio characteristic coefficients, signal processing circuits 34 for converting digital information into analog audio signals, amplification system 36 and transducers 38 for converting the amplified audio signals into sound. Wireless transmission 23 between the base unit 22 and receiver 30 is accomplished using infrared, radio frequency, magnetic coupling or other electromagnetic means.

To operate the unit, the user chooses a frequency and is prompted to adjust the balance at that frequency until the sound is perceived as centered between the left and right channels. For example, if the left channel is perceived as weaker, balancing will result in boosting the left signal until it is perceived as equal in volume (centered) to the user. The process is repeated at multiple frequencies within the audio spectrum. A simple version would use only bass, midrange and high audio frequencies, while more sophisticated versions could use many more frequencies. With the left and right signals balanced, the user may then be prompted to equalize the system to compensate for perceived differences in amplitude between different frequencies.

Upon completion of the balancing and equalization processes, the setting coefficients would preferably be downloaded to the solid-state memory 32 within the headphone unit 14. Alternately, the coefficients could be stored within the base transmitter or the signal source 20. The downloaded coefficients are used in conjunction with signal processing circuits 34 such as filters to provide real-time equalization for each ear. Duplex communication between the headphone and base unit is optional and may be used to provide handshaking during download of audio content. In a one-way communication system, a light emitting diode on the headphone unit 14 may be used to indicate successful downloading of data.

Figure 4:
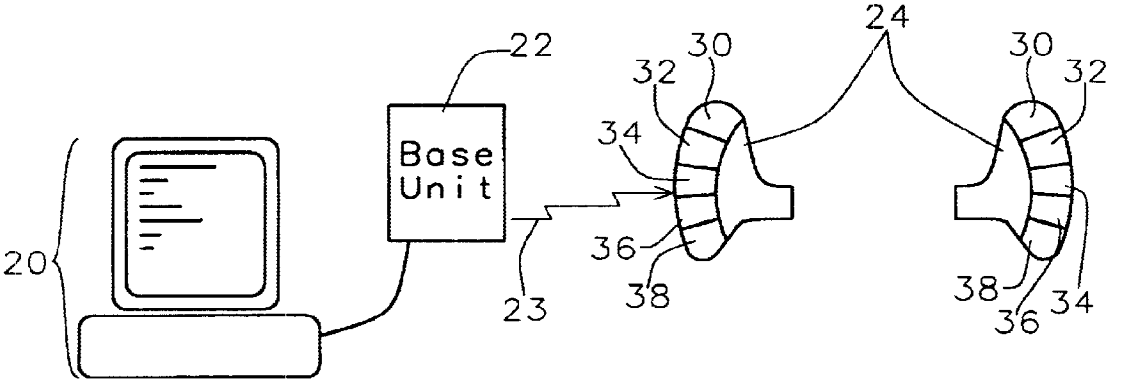
FIG. 4 illustrating a preferred embodiment of the present invention with hearing aids.

Refer now to FIG. 4, showing a system overview of a second embodiment of the present invention used in conjunction with a hearing aid system. A personal computer (as shown) or other sound source 20 is connected by wire to a base unit 22. The sound source 20 provides both an audio source and a user interface. A wireless connection is made to the hearing aid units 24 each containing a receiver 30 for downloading information from the base unit 22, solid-state memory 32 for storing audio characteristic coefficients, signal processing circuits 34 for transforming digital information into analog audio signals, amplification system 36 and transducers 38 for converting the amplified audio signals into sound. Wireless transmission 23 between the base unit 22 and receiver 30 is accomplished using infrared, radio frequency, magnetic coupling or other electromagnetic means. For example, a first input transducer converts sound waves into analog audio signals. A second transducer converts electromagnetic waves into analog audio signals.

Calibration is similar to the headphone unit. The user chooses a frequency and is prompted to adjust the balance at that frequency until the sound is perceived as centered between the left and right channels. The process is repeated at a plurality of frequencies within the audio spectrum. With the left and right signals balanced, the user may then be prompted to equalize the system to compensate for perceived differences in amplitude between different frequencies. Upon completion of the balancing and equalization processes, the setting coefficients are downloaded to solid-state memory 32 within the hearing aid units 24. The coefficients are used in conjunction with signal processing circuits 34 such as filters to provide real-time equalization for each ear. The signal processing circuits use the coefficient information to correct the amplitude of different frequency spectra of the analog signals (generated by the first or second transducer) resulting in corrected analog audio signals.

The hearing aid units 24 may be used in their normal mode to amplify sounds such as speech in proximity of the user 16. A second mode would allow public address content such as that from a theatre or church to be transmitted to the hearing aid units 24 by magnetic means. This signal would be detected by a detector within the hearing aid units 24.

The present invention is a device and method using an interactive process to improve the listening experience for a user of headphones or hearing aids. The system uses a sound source such as a PC or similar device. Programming of the headphone or hearing aid is accomplished using a process delivered by the sound source. The user is prompted to listen to various signals thereby testing the frequency response of each ear and headphone or hearing aid combination. Once the user testing is completed, individualized compensation coefficients are created to optimize the listening experience for the user. The coefficients are downloaded to and stored within the earpiece. Downloading for hearing aids may be accomplished by wire or by wireless means such as infrared, radio frequency, magnetic or electromagnetic coupling. In headphone units, the compensation factors could be either stored within the headphones or maintained at the sound source. In addition, headphone units may be operated with or without wires (using infrared, radio frequency, magnetic or electromagnetic coupling) for downloading or audio listening. Besides the benefits of improving the auditory perceptual balance over frequency for the individual, this system allows for correction of slightly defective or less costly, inferior transducers. This could bring an economic benefit to the headphone or hearing aid manufacturer.

While the invention has been particularly shown and described with reference to the preferred embodiments thereof, it will be understood by those skilled in the art that various changes in form and details may be made without departing from the spirit and scope of the invention.

What is claimed is:

1. An audio system having a testing mode and a listening mode comprising:

- a digital audio signal source comprising:
  - a means for supplying audio information; and
  - a user interface;
- a headphone or a hearing aid comprising left and right earphones each comprising:
  - a means for downloading said audio information from said digital audio signal source to said earphone;
  - a memory device for storing coefficient information wherein said coefficient information is obtained from a user through said user interface in response to testing of the hearing characteristics of said user in said testing mode;
  - a signal processor transforming said audio information from digital into analog signals and using said coefficient information to correct the amplitude of different frequency spectra of analog signals for said user in said listening mode thereby resulting in corrected analog signals;
  - an amplifier to increase the amplitude of said corrected left and right side analog audio signals; and
  - a transducer for converting said corrected analog signals into sound waves.

2. The device according to claim 1 wherein said means for downloading said audio information from said digital audio signal source to said earphone comprises wires, infrared transmission, radio frequency transmission, electromagnetic transmission, or magnetic transmission.

3. The device according to claim 1 wherein said testing of said hearing characteristics of said user is performed at a plurality of audio frequencies.

4. The device according to claim 3 wherein said left and right earphones are balanced and corrected such that at each of said plurality of audio frequencies said user perceives substantially equal loudness between said left and right side analog signals.

5. The device according to claim 3 wherein said left and right earphones are equalized and corrected such that at each of said plurality of audio frequencies said user perceives substantially equal loudness between each of said plurality of audio frequencies.

6. The device according to claim 1 wherein during said obtaining said coefficient information, said digital audio signal source is a personal computer.

7. A hearing aid system having a testing mode and a listening mode comprising:

- a digital audio signal source comprising:
  - a means for supplying audio information; and
  - a user interface;
- a hearing aid comprising left and right earphones each comprising:
  - a means for downloading said audio information from said digital audio signal source to said earphone;
  - a first input transducer to convert sound waves from said digital audio signal source into analog audio signals;
  - a second input transducer to convert electromagnetic waves from said digital audio signal source into analog audio signals;
  - a memory device for storing coefficient information wherein said coefficient information is obtained from a user through said user interface in response to testing of the hearing characteristics of said user in said testing mode;
  - a signal processor using said coefficient information to correct the amplitude of different frequency spectra of said analog audio signals generated from either said first input transducer or said second input transducer for said user thereby resulting in corrected analog audio signals in said listening mode;
  - an amplifier to increase the amplitude of said corrected electrical signals; and
  - an output transducer for converting said corrected electrical signals into sound waves.

8. The device according to claim 7 wherein said electromagnetic waves applied to said second input transducer are generated by said digital audio source.

9. The device according to claim 7 wherein said electromagnetic waves applied to said second input transducer are generated by an external source.

10. The device according to claim 7 wherein said means for downloading said audio information from said digital audio signal source to said earphone comprises wires.

11. The device according to claim 7 wherein said means for downloading said audio information from said digital audio signal source to said earphone comprises infrared transmission.

12. The device according to claim 7 wherein said means for downloading said audio information from said digital audio signal source to said earphone comprises radio frequency transmission.

13. The device according to claim 7 wherein said means for downloading said audio information from said digital audio signal source to said earphone comprises electromagnetic transmission.

14. The device according to claim 7 wherein said means for downloading said audio information from said digital audio signal source to said earphone comprises magnetic transmission.

15. The device according to claim 7 wherein said testing of said hearing characteristics of said user is performed at a plurality of audio frequencies.

16. The device according to claim 15 wherein said left and right earphones are balanced and corrected such that at each of said plurality of audio frequencies said user perceives substantially equal loudness between said left and right side analog signals.

17. The device according to claim 15 wherein said left and right earphones are equalized and corrected such that at each of said plurality of audio frequencies said user perceives substantially equal loudness between each of said plurality of audio frequencies.

18. The device according to claim 7 wherein during said obtaining said coefficient information, said digital audio signal source is a personal computer.

19. A headphone system having a testing mode and a listening mode comprising:

- a digital audio signal source comprising:
  - a means for supplying audio information; and
  - a user interface;
- a memory device for storing coefficient information wherein said coefficient information is obtained from a user through said user interface in response to testing of the hearing characteristics of said user in said testing mode; and
- a headphone comprising left and right earphones each comprising:
  - a means for downloading said audio information from said digital audio signal source to said earphone;
  - a signal processor transforming said audio information from digital into analog signals and using said coefficient information to correct the amplitude of different frequency spectra of analog signals for said user thereby resulting in corrected analog signals in said listening mode;
  - an amplifier to increase the amplitude of said corrected left and right side analog audio signals; and
  - a transducer for converting respectively said corrected analog signals into sound waves.

20. The device according to claim 19 wherein said means for downloading said audio information from said digital audio signal source to said earphone comprises wires.

21. The device according to claim 19 wherein said means for downloading said audio information from said digital audio signal source to said earphone comprises infrared transmission.

22. The device according to claim 19 wherein said means for downloading said audio information from said digital audio signal source to said earphone comprises radio frequency transmission.

23. The device according to claim 19 wherein said means for downloading said audio information from said digital audio signal source to said earphone comprises electromagnetic transmission.

24. The device according to claim 19 wherein said means for downloading said audio information from said digital audio signal source to said earphone comprises magnetic transmission.

25. The device according to claim 19 wherein said testing of said hearing characteristics of said user is performed at a plurality of audio frequencies.

26. The device according to claim 25 wherein said left and right earphones are balanced and corrected such that at each of said plurality of audio frequencies said user perceives substantially equal loudness between said left and right side analog signals.

27. The device according to claim 25 wherein said left and right earphones are equalized and corrected such that at each of said plurality of audio frequencies said user perceives substantially equal loudness between each of said plurality of audio frequencies.

28. The device according to claim 19 wherein said memory device is contained within said digital audio signal source.

29. The device according to claim 19 wherein said memory device is contained within said earphones.

30. The device according to claim 19 wherein during said obtaining said coefficient information, said digital audio signal source is a personal computer.

* * * * *

UNITED STATES PATENT AND TRADEMARK OFFICE

CERTIFICATE OF CORRECTION

PATENT NO. : 6,668,204 B2 
DATED : December 23, 2003
INVENTOR(S) : Chong Lim Neoh It is certified that error appears in the above-identified patent and that said Letters Patent is hereby corrected as shown below:

Title page,
Item [54], Title, should read -- BIAURAL (2 CHANNEL) LISTENING DEVICE THAT IS EQUALIZED IN-SITU TO COMPENSATE FOR DIFFERENCES BETWEEN LEFT AND RIGHT EARPHONE TRANSDUCERS AND THE EARS THEMSELVES --.

Signed and Sealed this

Twenty-fourth Day of February, 2004

JON W. DUDAS
*Acting Director of the United States Patent and Trademark Office*

UNITED STATES PATENT AND TRADEMARK OFFICE

CERTIFICATE OF CORRECTION

PATENT NO. : 6,668,204 B2 
APPLICATION NO. : 09/969691
DATED : December 23, 2003
INVENTOR(S) : Chong Lim Neoh It is certified that error appears in the above-identified patent and that said Letters Patent is hereby corrected as shown below:

Title page in the Assignee, item (73), delete Assignee, "Free Systems Pte. Ltd., Singapore (SG)" and replace with -- FreeSystems Pte. Ltd., Singapore (SG) --.

Signed and Sealed this

Thirteenth Day of October, 2009

David J. Kappos

David J. Kappos
*Director of the United States Patent and Trademark Office*